US011719726B2

(12) United States Patent
Fiorille et al.

(10) Patent No.: US 11,719,726 B2
(45) Date of Patent: Aug. 8, 2023

(54) OPTICAL SENSOR SYSTEM HAVING A SEGMENTED MAGNETIC FLUX CONCENTRATOR AND METHODS OF USE THEREOF

(71) Applicant: Micatu Inc., Horseheads, NY (US)

(72) Inventors: Anthony Fiorille, Horseheads, NY (US); James Kennedy, Corning, NY (US); Michael Oshetski, Horseheads, NY (US)

(73) Assignee: MICATU INC., Horseheads, NY (US)

( * ) Notice: Subject to any disclaimer, the term of this patent is extended or adjusted under 35 U.S.C. 154(b) by 13 days.

(21) Appl. No.: 17/487,474

(22) Filed: Sep. 28, 2021

(65) Prior Publication Data

US 2022/0099710 A1 Mar. 31, 2022

Related U.S. Application Data

(60) Provisional application No. 63/084,222, filed on Sep. 28, 2020.

(51) Int. Cl.
*G01R 15/24* (2006.01)
*G01R 19/00* (2006.01)
*G01R 15/18* (2006.01)

(52) U.S. Cl.
CPC ......... *G01R 15/246* (2013.01); *G01R 15/186* (2013.01); *G01R 19/0092* (2013.01)

(58) Field of Classification Search
CPC . G01R 15/246; G01R 15/186; G01R 19/0092
See application file for complete search history.

(56) References Cited

U.S. PATENT DOCUMENTS

| 4,262,275 A | | 4/1981 | Demarco et al. |
| 4,999,571 A | * | 3/1991 | Ishiko ................. G01R 15/142 324/96 |
| 5,202,812 A | * | 4/1993 | Shinoda ................. G01R 31/52 361/93.6 |

(Continued)

OTHER PUBLICATIONS

International Search Report and Written Opinion for PCT/US2021/052352, dated Dec. 29, 2021.

(Continued)

*Primary Examiner* — Dominic E Hawkins
(74) *Attorney, Agent, or Firm* — Troutman Pepper Hamilton Sanders LLP (Rochester)

(57) ABSTRACT

The present technology relates to a current sensing device utilizing a magnetic flux concentrator loop composed of segmented ferromagnetic components. The concentrator loop is designed to focus magnetic flux generated by a current carrying cable, wire, or conductor along the Faraday rotation axis of a magneto-optic sub-assembly. The segmented magnetic flux concentrator encompassing the current carrying cable is held close to a circumferential geometry about the cable, in order to maximize magnetic flux concentration on the magneto-optic sensor. The segmented design of the magnetic flux concentrator loop, combined with a clamping mechanism, allows for easy, straightforward attachment and detachment, during installation and removal or the current sensing device from the current carrying cable.

16 Claims, 7 Drawing Sheets

(56) References Cited

U.S. PATENT DOCUMENTS

| | | | |
|---|---|---|---|
| 8,525,512 B2* | 9/2013 | Sorensen | G01R 1/22 |
| | | | 324/96 |
| 11,391,761 B2* | 7/2022 | Hoppe | G01R 15/202 |
| 2016/0069936 A1 | 3/2016 | Harlev et al. | |
| 2018/0038897 A1 | 2/2018 | Milano et al. | |
| 2018/0059144 A1* | 3/2018 | Davis | G01R 1/071 |

OTHER PUBLICATIONS

International Preliminary Report on Patentability for PCT/US2021/052352, dated Mar. 28, 2023.

\* cited by examiner

OPTICAL SENSOR SYSTEM HAVING A SEGMENTED MAGNETIC FLUX CONCENTRATOR AND METHODS OF USE THEREOF

This application claims the benefit of U.S. Provisional Patent Application Ser. No. 63/084,222, filed Sep. 28, 2020, which is hereby incorporated by reference in its entirety.

FIELD

This technology relates generally to an optical sensor system and methods of use thereof. More particularly this technology relates to an optical sensor system, having a segmented magnetic flux concentrator, that may be employed for sensing both current and voltage levels in a current carrying cable of an electric power distribution system and methods of use thereof.

BACKGROUND

A variety of sensors have been developed for measuring the current in a current carrying cable, such as the current carrying cables employed in high voltage electricity distribution systems. Optical current sensors based on the Faraday effect have been utilized to measure current in a currently carrying cable. Such sensors typically employ bulk glass or fiber optic cable that surrounds the current carrying cable. While these types of sensors have a very high dynamic range, they require opening the current carrying cable at installation. Thus, these types of sensors are expensive to employ in high voltage electricity distribution systems.

Optical current sensors utilizing a magnetic concentrator with bulk optics in an air gap have also been employed. The air gap stabilizes the temperature sensitivity of the magnetic material. Increasing the air gap of the magnetic concentrator may increase the saturation level, but may also increase the sensitivity to adjacent fields. Due to saturation, the magnetic concentrator may limit the dynamic range, which limits the usability of such sensors for electric utilities, as described below.

Traditional optical sensors are typically designated for different applications required by electric utilities. Thus, multiple sensors are required for each of the different applications. For example, current and voltage transformers are used for metering and demand response, while Rogowsky Coil or Hall effect devices are used for fault allocation and system protection. A fully fiber optic or bulk current sensor can naturally be used for all applications, but is expensive and cannot be clamped to the cable, which makes installation difficult.

Devices and methods for measuring the current and the voltage in real-time in a current carrying cable using optical sensors have been employed. However, these devices and methods fail to provide a low cost and simple sensor design for accurate measurements at large dynamic range, sensitivity, and bandwidth, that is capable of being installed on the current carrying cable without disturbing the function of the cable.

The present technology addresses these and other deficiencies in the prior art.

SUMMARY

One aspect of the present technology relates to an optical current sensor system. The optical current sensor system includes an optical sensor positioned within a housing. A magnetic flux core concentrator is configured to be coupled to the housing. The magnetic flux core concentrator is configured to releasably couple the optical sensor to a current carrying cable.

Another aspect of the present technology relates to a method of measuring current in a current carrying cable using the disclosed optical current sensor system. The method includes installing the optical current sensor system on the current carrying cable. Current is measured in the current carrying cable using the optical current sensor system.

The present technology provides an optical sensor system that may be employed for measuring the current and/or voltage from a current carrying cable. The method comprises steps of providing an optical sensor assembly comprising a base unit, and an optical current sensor mounted on the base unit for transmitting a beam of polarized electromagnetic radiation and coupling input and output beams optical fibers. A light detector is also provided having a first channel that operably connects the light detector to an analog to digital converter through a programmable gain amplifier, a second channel that operably connects the light detector directly to the analog to digital converter, and a processor operably connected to the analog to digital converter. The optical sensor assembly is mounted adjacent the current carrying cable, and is operably connected to a light detector. A plurality of factors are then evaluated from rotation information from the light detector, by using the first and second channels for analog to digital conversion operably connected with the processor.

One objective of the present technology is to provide a system and method for sensing current that allows for measurements of currents over a wide dynamic range that generate corresponding low to high magnetic fluxes in high voltage transmission lines.

Another objective is to provide a system that provides simplicity and ease of use and installation. The present technology allows for the use of a single current sensor that is capable of precise and accurate measurement of currents over a wide dynamic range, which can therefore be utilized over a wide variety of high voltage power transmission lines, as represented by a variety of specified class voltages. The present technology provides the value and utility of having one current sensor suitable for deploying over multiple high voltage electrical power transmission applications.

Another objective is to provide a method for sensing current on a current carrying cable without having to cut or otherwise disrupt the function of the cable.

A further objective is to provide a system and method for sensing current that enables an improved dynamic range and sensitivity of measurement for an optical current sensor, by using the magnetic concentrator with a distributed-air gap, a round shape, and silica steel materials.

A further objective is to provide a system and method for sensing current that includes control elements operably connected to the sensor only with optical fibers, and is properly grounded, so that there is reduced danger of high voltage transfer to the control elements.

A further objective is to provide a system and method for sensing current that enables several instruments to be operably connected to an optical sensor for measuring several qualities of the current simultaneously.

Other features and advantages of the present technology will become apparent from the following more detailed description, taken in conjunction with the accompanying drawings, which illustrate, by way of example, the principles of the technology.

DETAILED DESCRIPTION

Figure 1A:
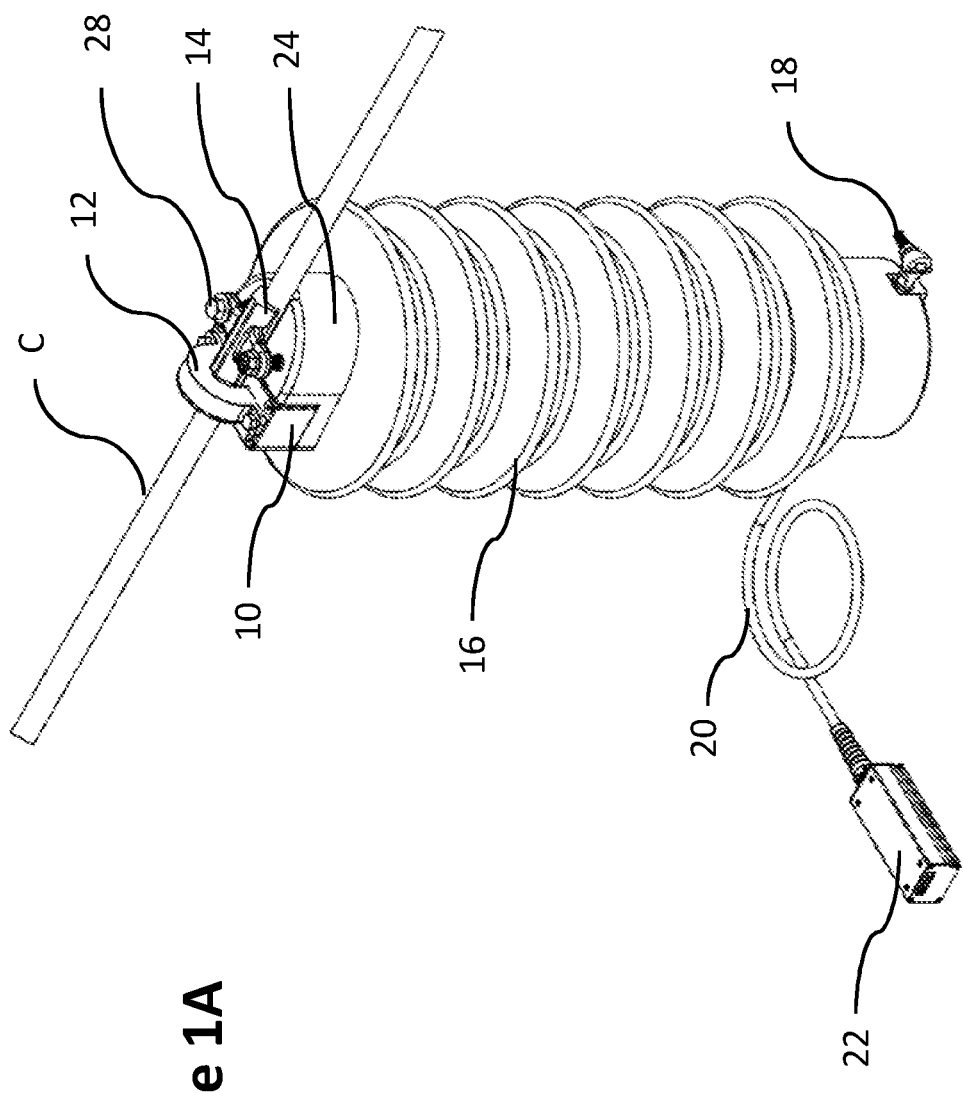
FIG. 1A is a perspective view of an exemplary optical sensor system of the present technology in proximity to a current carrying cable with a magnetic flux concentrator sub-assembly located proximate to the currently carrying cable.

This technology relates generally to an optical sensor system and methods of use thereof.

One aspect of the present technology relates to an optical current sensor system. The optical current sensor system includes an optical sensor positioned within a housing. A magnetic flux core concentrator is configured to be coupled to the housing. The magnetic flux core concentrator is configured to releasably couple the optical sensor to a current carrying cable.

An exemplary optical sensor system 1 for use in measuring the current flowing in a current carrying cable C is illustrated in FIGS. 1-6. Optical sensor system 1 includes an optical current sensor 10, a magnetic flux concentrator sub-assembly 12, a clamp 14, a sensor insulator body 16, a ground clamp 18, a fiber optic cable 20, and a plug-in unit 22, although the optical sensor system 1 can include other types and/or numbers of additional components, elements, or devices in other combinations, such as a light source and a light detector coupled to the plug-in unit 22, by way of example only. The exemplary optical sensor system 1 provides a number of advantages including providing for precise and accurate measurements of currents over a wide dynamic range that generate corresponding low to high magnetic fluxes in high voltage transmission lines. Further, the optical sensor system 1 provides for easy installation on the current carrying cable C without having to disrupt the current carrying cable C, which provides for a decreased installation costs. Further, the optical sensor system 1 can be utilized for multiple high voltage electrical power transmission applications, including metering and demand response, fault detection, and assessment of power quality, by way of example only.

In one example, current carrying cable C is a power transmission line in a smart grid operated by an electric utility company. An electric utility has various requirements for the dynamic range of the current sensors, depending on the application. For example, for metering and demand response, dynamic ranges of about zero to greater than twice the nominal current may be acceptable. When fault detection is required, a dynamic range in the range of greater than ten times the nominal current has to be measured in real-time. For assessment of power quality, the measurement of the harmonics is critical, so higher bandwidths such as up to 6 kHz may be typically required. Smart grids deliver electricity from suppliers to consumers using digital technology to save energy, reduce cost, and increase reliability and transparency. Optical sensor system 1 can be used for each of these multiple applications, i.e., metering and demand response, fault detection, and assessment of power quality.

Figure 1B:
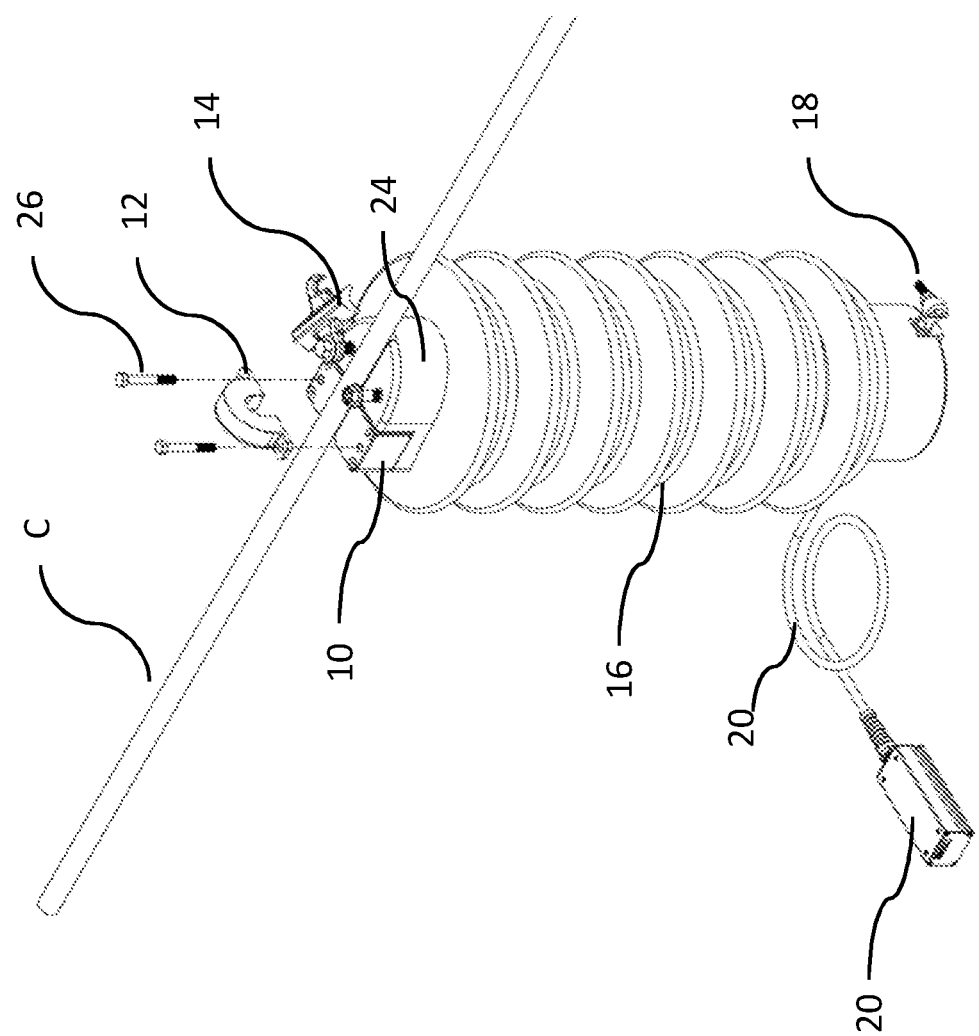
FIG. 1B is a partial perspective view and partial exploded view of the exemplary optical sensor system shown in FIG. 1A with the magnetic flux concentrator sub-assembly detached from the current sensor housing.
Figure 2A:
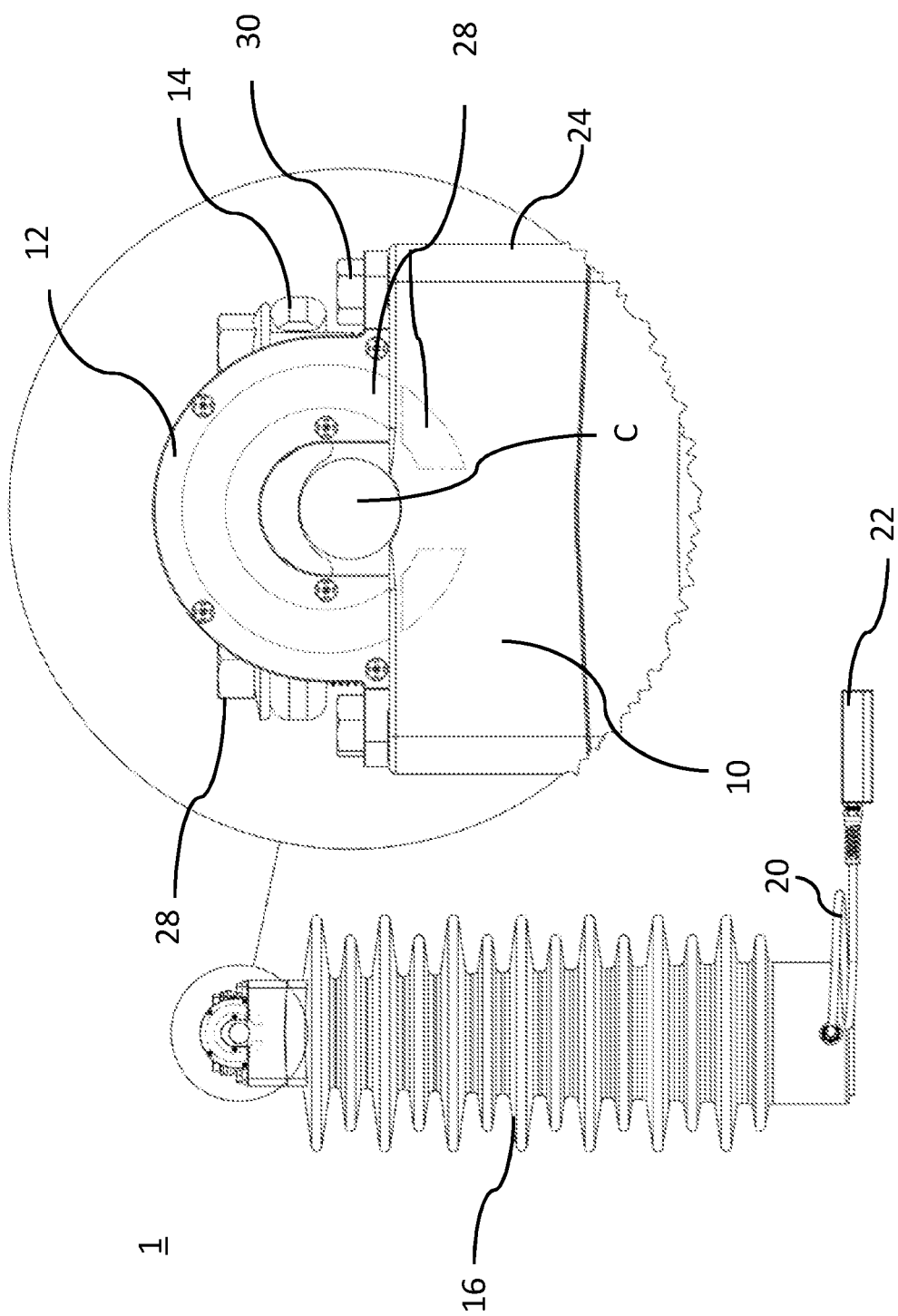
FIG. 2A is a side view of the optical sensor system with a magnified view of the optical sensor and magnetic flux concentrator sub-assembly in a partial phantom view.
Figure 2B:
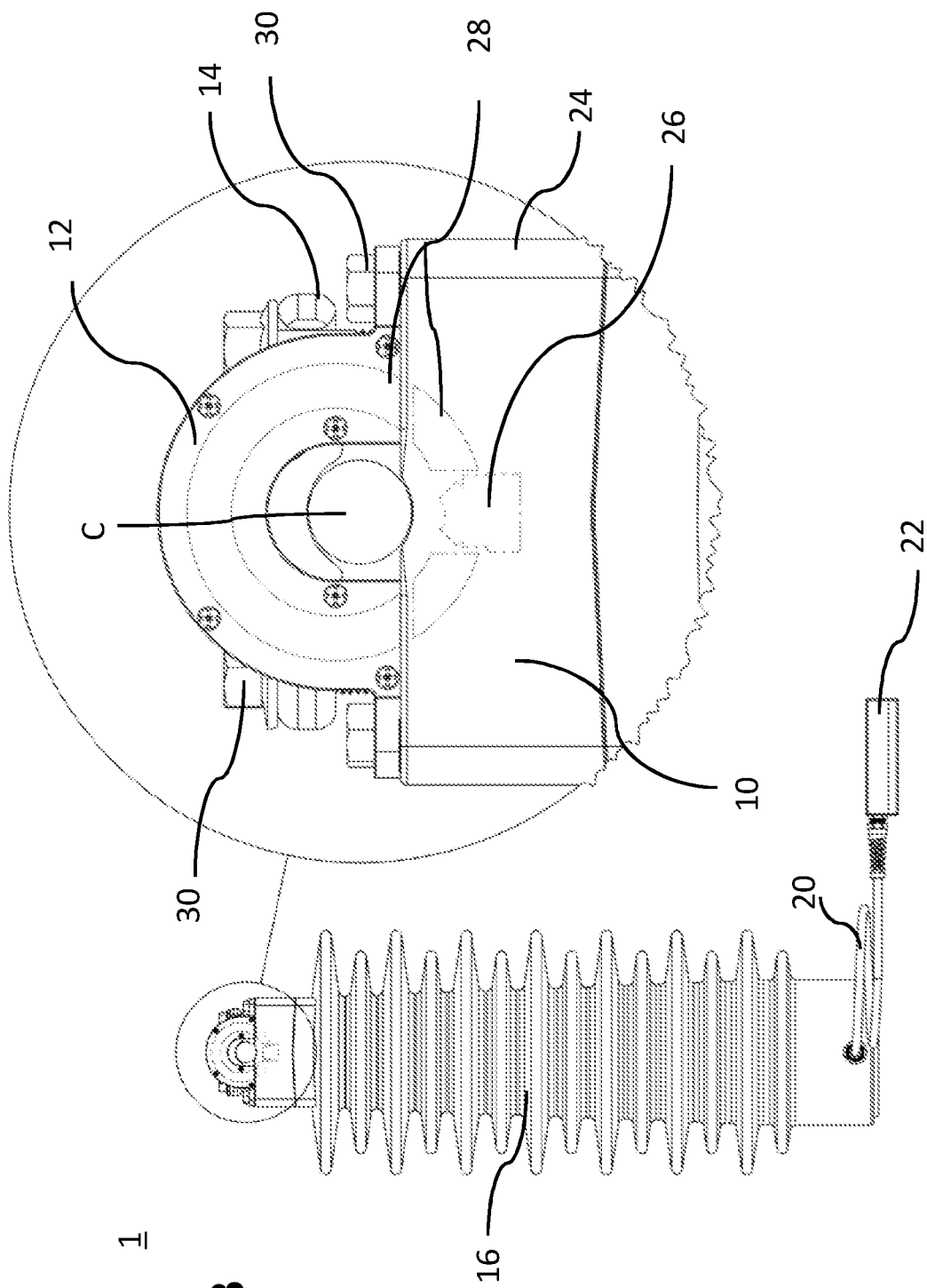
FIG. 2B is a side view of the optical sensor system with a magnified view of the optical sensor and magnetic flux concentrator sub-assembly in a partial phantom view with the current sensing crystal.

Referring now more specifically to FIGS. 1A and 1B, optical current system 1 includes optical current sensor 10 located in proximity to the current carrying cable C. In this example, optical current sensor 10 is a high voltage current sensor configured to operate in a medium voltage range of about 1.2 kV to about 69 kV, although other current sensors configured to operate in other voltage ranges may be employed. Optical current sensor 10 includes a housing 24 that houses the optical components of the optical current sensor 10, including a current sensing crystal 26, as shown in FIG. 2B. The current sensing crystal 26, by way of example, can be configured similarly in position with respect to the input and output optical fibers as disclosed in U.S. Pat. No. 9,341,653, the disclosure of which is incorporated by reference herein in its entirety. The housing 24 is also configure to receive a portion of the magnetic flux concentrator sub-assembly 12 in a gap thereof as described below.

As shown in FIG. 1A, during use, the current carrying cable C extends over one end of the optical current sensor 10 with the magnetic flux concentrator sub-assembly 12 surrounding the current carrying cable C. The magnetic flux concentrator sub-assembly 12 is attached to the housing 24 of the optical current sensor 10 by a series of fasteners 30. In this example, the fasteners 30 are hex bolts, although type and/or number of fasteners that are configured to provide sufficient fastening strength could be used for this function. Non-limiting examples of additional fasteners may include eye-bolts, mechanical clamps, etc. FIG. 1B shows an exploded view of the optical sensor system 1 with the magnetic flux concentrator sub-assembly 12 detached from the housing 24 of the optical current sensor 10 in order to demonstrate how the optical sensor system 1 is hung from and attached to the current carrying cable C. As shown in FIGS. 2A and 2B the housing 24 of the optical sensor 10 lies at the top of the sensor insulator body 16.

Figure 4:
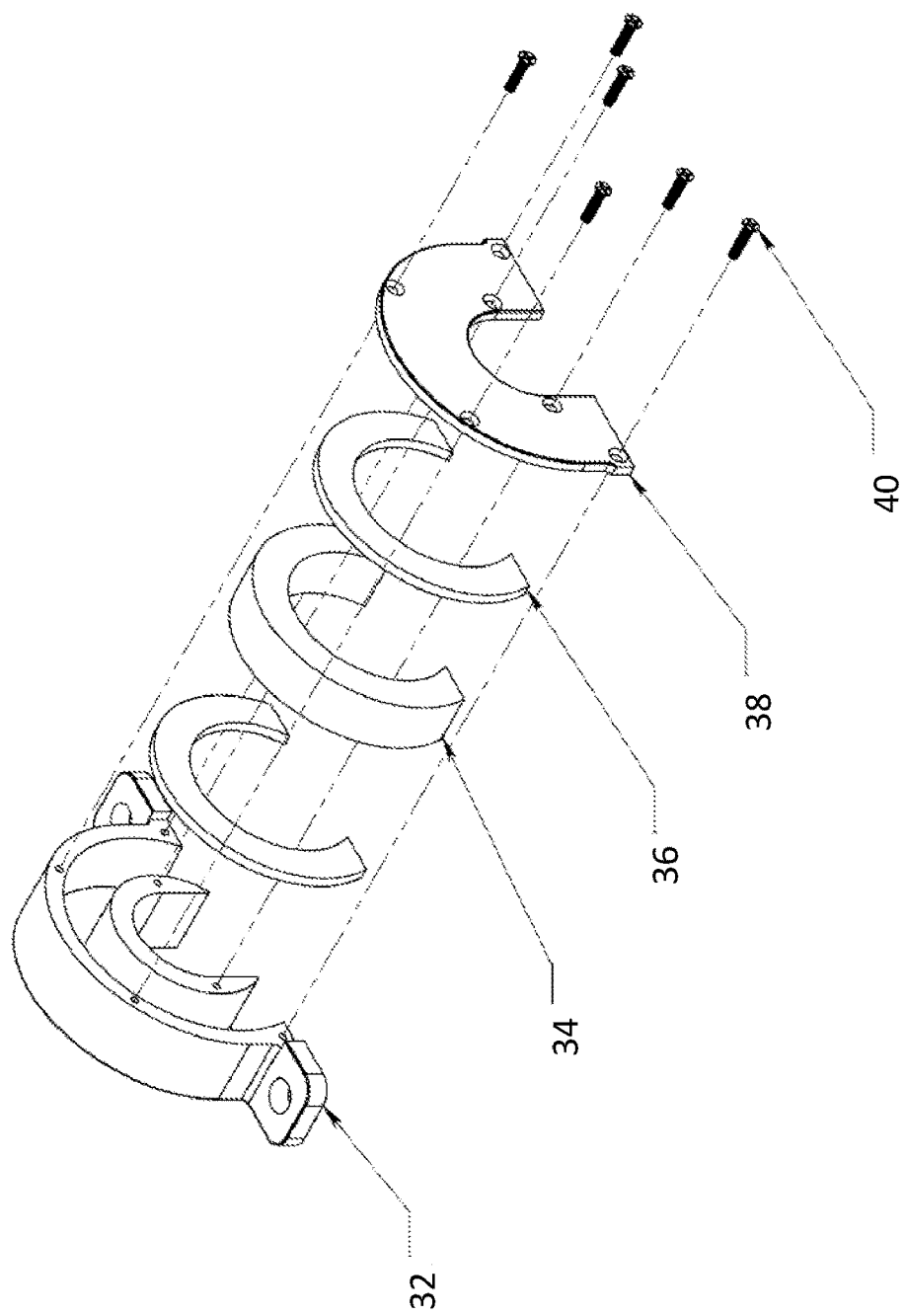
FIG. 4 is an exploded view of the magnetic flux concentrator sub-assembly.

Referring now more specifically to FIGS. 2A, 2B, and 4, the magnetic flux concentrator sub-assembly 12, includes one or more segmented core components 28 located therein. As shown in FIG. 2A, at least a portion of the segmented core components 28 are located within a gap within the housing 24 of the optical current sensor. As shown in FIG. 2B, the current sensing crystal 26 is shown within the gap of the housing 24 between the segmented core components 28.

FIG. 4 is an exploded view of the magnetic flux concentrator sub-assembly 12. The magnetic flux concentrator sub-assembly 12 includes a flux concentrator housing 32 that is configured to be coupled to the housing 24 of the optical sensor 10. The flux concentrator housing 32 is located around the other components of the magnetic flux concentrator sub-assembly 12 including the segmented core components 28 as shown in FIGS. 2A and 2B. Referring again to FIG. 4, the segmented core components 28 include a flux concentrator core 34 that is located within the flux concentrator housing 32 and is sandwiched between two flux concentrator cover foam inserts 36, that are crucial to protecting the flux concentrator core 34 from environmental degradation due to temperature and humidity extremes as well as ingress of water, dust or dirt, and other foreign particles. The insulating foam inserts 36 provide barriers that are placed between the flux concentrator core 34 and the flux concentrator housing 32 to provide protection against corrosion, metal fatigue, shock, as well other possible environmental effects. The components of the magnetic flux concentrator sub-assembly 12 are covered by the flux concentrator cover 38, which is secured to the flux concentrator housing 32 by the housing cover screws 40.

Referring again to FIGS. 2A and 2B, the concentrator loop of the magnetic concentrator sub-assembly 12 has a circumferential geometry, composed of the segmented ferromagnetic components 28. A gap in the circumferential geometry, allows for optimal placement of the crystal 26, such that magnetic flux lines are concentrated and focused for maximal overlap with the Faraday rotation axis of the crystal 26 of the magneto-optic sub-assembly of the optical sensor 10.

A circumferential ferromagnetic concentrator core, subtending a continuous radial arc, is ideal for accommodating the widest range of magnetic fluxes, from high to low, to be directed upon the Faraday rotation axis of the optical current sensor given by the direction of light. A circumferential concentrator loop can also provide a high magnetic saturation limit, reduce eddy currents and losses to a minimum, which can be important in high-frequency applications in order to observe and precisely characterize current harmonics. Using denser ferromagnetic materials in the magnetic concentrator loop, that mimic a circumferential core to the greatest extent possible, even if containing segmented elements, can reduce negative effects of core losses and keep associated electromagnetic inductive heat buildup to a minimum. The segmented, circumferential, magnetic core concentrator elements should be generated and deployed in a robust, temperature and environmentally stable arrangement within an enclosure, or housing, thus making a compact fixture.

Figure 3:
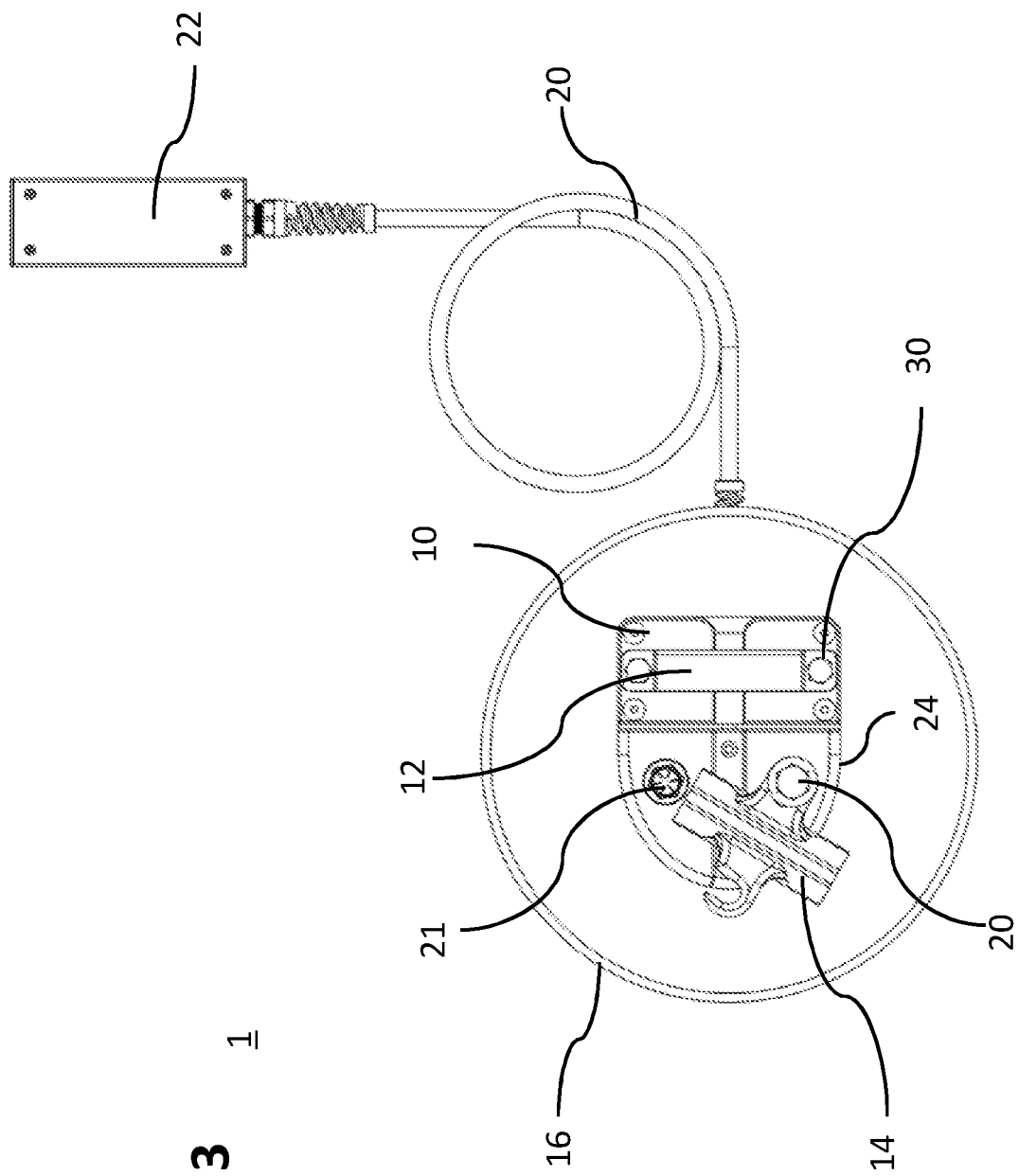
FIG. 3 is a top view of the optical sensor system.

Referring now to FIGS. 1A, 2A, and 3, the clamp 14 is configured to couple the magnetic flux concentrator sub-assembly 12 to the housing 24 of the optical current sensor 10. FIG. 3 is a top view of the optical sensor system 1 showing the location of the magnetic flux concentrator sub-assembly 12 fastened to the housing 24 of the optical current sensor 10 via hex bolt fasteners 30, although other types of fasteners may be employed. The clamp 14 is pivotably coupled to the housing 24 such that the clamp 14 is configured to pivot open or closed to hold the current carrying cable (not shown) in place. The clamp 14 has a pivot point 42, which can be a bolt, screw or any similar structure that allows the clamp 14 to pivot at a certain point, and a tightening bolt 44, which is used to tighten, and hold the clamp 14 in place when the optical sensor system 1 is installed on the current carrying cable C. The tightening bolt 42 can be any type of bolt or screw known in the art. Additionally, other tightening mechanisms can be used in place of the tightening bolt as long as those mechanisms allow the clamp 14 to be held securely in place. The clamp 14 is designed for straightforward and secure attachment of the optical sensor system 1 to the current carrying cable C, and is able to support the weight of the entire optical sensor system 1. Upon removal of the hex bolts 30, and the magnetic flux concentrator sub-assembly 12, the optical sensor system 1 can be detached, and easily removed from the current carrying cable C.

The housing 24 of the optical sensor 10 is coupled to the sensor insulator body 16. The sensor insulator body 16 includes ground clamp 18 located at its distal end. The fiber optic cable 20 extends from the plug-in-unit 22 into the sensor insulator body 16. In some examples, the plug-in unit 22 is coupled to the fiber optic cable 20 and includes hardware, such as analog to digital converters that allow the optical sensor 10 to be coupled to a processing unit (not shown) and contains fiber cables that deliver collimated light to the current sensor head (not shown).

Figure 5:
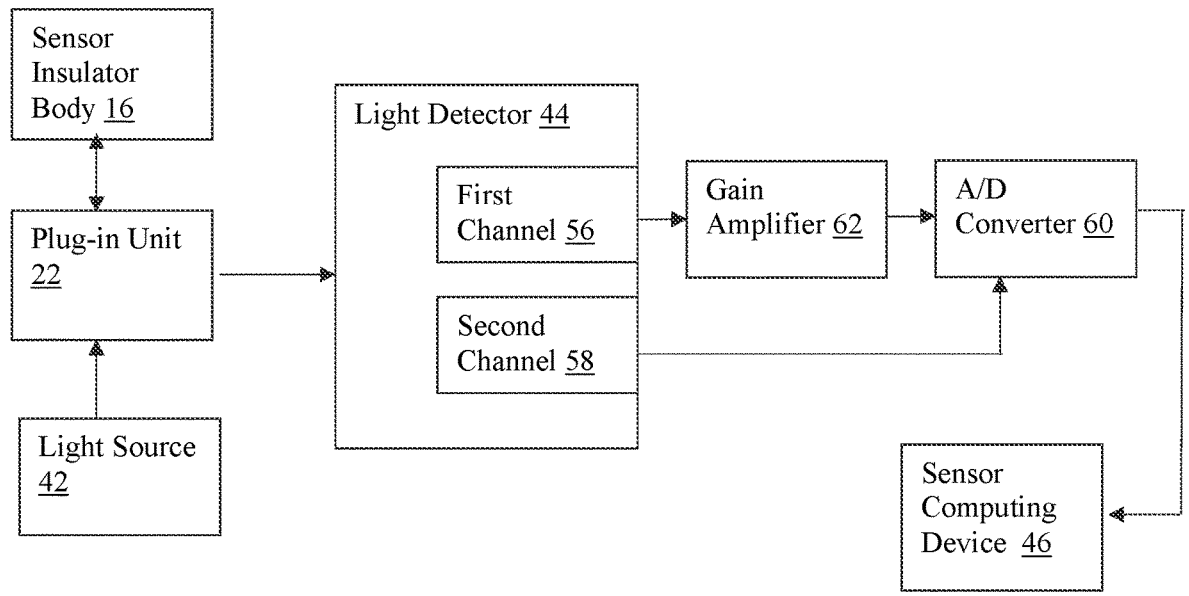
FIG. 5 is a block diagram of an exemplary optical sensor system of the present technology.
Figure 6:
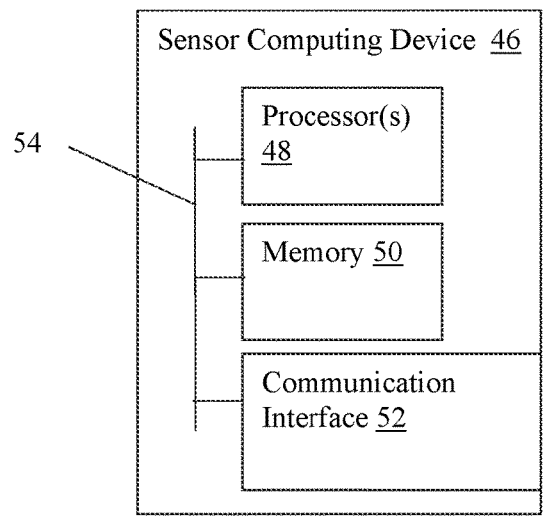
FIG. 6 is a block diagram of an exemplary sensor computing device of the present technology.

Referring now more specifically to FIG. 5, optical sensor system 1 for use in measuring the current flowing in a current carrying cable C can also include light source 42, light detector 44, and sensor computing device 46, although the optical sensor system 1 can include other types and/or numbers of additional components, such as additional optics or additional electronics. In one example, light source 42 is a laser configured to provide a beam of polarized electromagnetic radiation that is transmitted to the crystal 26 through one or more optical fibers coupled to the plug-in unit 22, by way of example, although other suitable light sources and other methods of transmission may be employed. Light source 42 may also include additional optics not described herein, such as collimators. Light detector 44 is positioned and configured to collect and measure an output beam from the crystal 26 delivered to light detector 44 through one or more optical fibers. Various light detectors known in the art may be employed for light detector 44. In one example, the light detector 44 has a first channel 56 that operably connects the light detector 46 to an analog to digital converter 60 through a programmable gain amplifier 62, and a second channel 58 that operably connects the light detector 44 directly to the analog to digital converter 60, and the sensor computing device 46, which is operably connected to the analog to digital converter 60, although in other examples analog to digital converter 60 and programmable gain amplifier may be integrated in sensor computing device 46.

The sensor computing device 46 is configured to determine a current and/or voltage for the current carrying cable C based on rotation information received from the light detector 44 based on the output beam from the crystal 26 of the optical sensor system 1 in accordance with the methods described herein. Sensor computing device 46 includes a processor 48, a memory 50, and a communication interface 52, which are coupled together by a bus 54 or other communication link, although other numbers and types of systems, devices, components, and elements in other configurations and locations can be used.

Processor 48 executes a program of instructions stored in memory 50 for one or more aspects of the present technology. For example, processor 48 can execute instructions to determine a current and/or voltage for the current carrying cable C based on rotation information received from the light detector 44 based on the output beam from the crystal 26 of the optical sensor system 1. Other numbers and types of systems, devices, components, and elements in other configurations and locations can be used to execute the program of instructions stored in the memory 50.

The memory 50 stores these programmed instructions for one or more aspects of the present technology, although some or all of the programmed instructions could be stored and/or executed elsewhere. A variety of different types of memory storage devices, such as a random access memory (RAM), read only memory (ROM), hard disk, CD ROM, DVD ROM, or other computer readable medium which is read from and written to by a magnetic, optical, or other reading and writing system that is coupled to the processor, can be used for the memory.

The communication interface 52 is used to operatively couple and communicate between the sensor computing device 46 and one or more other computing devices via a communications network. Such one or more computing devices may be employed in a smart grid, by way of example only. Other types and numbers of communication networks or systems with other types and numbers of connections and configurations can be used for communication between the sensor computing device 46 and one or more other computing devices, for example, in a smart grid. By way of example only, the communications network could use TCP/IP over Ethernet and industry-standard protocols, including NFS, CIFS, SOAP, XML, LDAP, and SNMP. Other types and numbers of communication networks, such as a direct connection, a local area network, a wide area network, modems and phone lines, e-mail, and wireless communication technology, each having their own communications protocols, can be used by the communication networks.

Another aspect of the present technology relates to a method of measuring current in a current carrying cable using the disclosed optical current sensor system. The method includes installing the optical current sensor system on the current carrying cable. Current is measured in the current carrying cable using the optical current sensor system.

An exemplary operation of the optical sensor system 1 will now be described with reference to FIGS. 1-6. The optical sensor system 1 is used to measure current in a current carrying cable C. The optical sensor system 1 is installed on the current carrying cable C without the need to alter the current carrying cable C. The optical sensor 10 is installed proximate to the current carrying cable C with the magnetic flux concentrator sub-assembly 12 surrounding the current carrying cable C. The magnetic flux concentrator sub-assembly is secured to the optical sensor 10 using hex bolts 30 as well as clamp 14, which fits onto the current carrying cable C. The design of the magnetic flux concentrator sub-assembly 12 is advantageous, in that being segmented, it thereby allows for easy attachment of the components or portions of the loop over the current carrying cable C. The current carrying cable C aligns and runs through the magnetic flux concentrator sub-assembly and upon attachment during installation, the loop of the magnetic flux concentrator sub-assembly 12 closes over the current carrying cable 12. The magnetic flux concentrator sub-assembly 12 is installed such that the crystal 26 of the optical sensor 10 is located in a gap of the segmented core 28.

After installation, the optical sensor system 1 may be employed to measure the current and/or voltage from the current carrying cable C. A beam of polarized electromagnetic radiation is transmitted to the crystal 26 from light source 42 through one or more optical fibers. An output beam is collected and delivered to the light detector 44 through one or more optical fibers. In one example, the light detector 44 has a first channel 56 that operably connects the light detector 46 to an analog to digital converter 60 through a programmable gain amplifier 62, and a second channel 58 that operably connects the light detector 44 directly to the analog to digital converter 60, and the sensor computing device 46. The optical sensor system 1 is mounted adjacent the current carrying cable C, and is operably connected to the light detector 44. A plurality of factors are then evaluated from rotation information from the light detector 44, by using the first and second channels 56 and 58 for analog to digital conversion operably connected with the sensor computing device 46.

Accordingly, the present technology provides a number of advantages including providing an optical sensor system that may be easily installed on transmission lines to provide precise current measurements without impacting the transmission lines during installation.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. An optical current sensor system, comprising:
a magneto-optical sensor positioned within a housing; and
a magnetic flux core concentrator configured to be coupled to the housing, wherein the magnetic flux core concentrator is configured to releasably couple the magneto-optical sensor to a current carrying cable and comprises two or more segmented ferromagnetic cores that are:
configured to focus a magnetic field of the current carrying cable upon the magneto-optical sensor; and
aligned with magnetic field lines of the magnetic field of the current carrying cable, wherein the magnetic field lines describe a circumferential arc and each of the two or more segmented ferromagnetic cores subtends an angular portion of the circumferential arc that is less than $2\pi$ radians or 360 degrees.

2. The optical current sensor system of claim 1, wherein the magnetic flux core concentrator is configured to surround the current carrying cable during use.

3. The optical current sensor system of claim 1, wherein the magnetic flux core concentrator comprises one or more segments configured to releasably couple the optical sensor to the current carrying cable.

4. The optical current sensor system of claim 1, wherein the two or more segmented ferromagnetic cores are formed from one or more of grain-oriented steel, laminated steel, pressed powder iron, or combinations thereof.

5. The optical current sensor system of claim 1, wherein at least one of the two or more segmented ferromagnetic cores has a continuous element having an angular arc greater than or equal to 180 degrees or $\pi$ radians about a radius at a vertex of a cross-section of the current carrying cable.

6. The optical current sensor system of claim 1, wherein the magneto-optical sensor comprises a crystal.

7. The optical current sensor system of claim 1, wherein the two or more segmented ferromagnetic cores are encased within an environmentally secure housing.

8. The optical current sensor system of claim 1, further comprising a clamping mechanism coupled to the housing and configured to clamp the housing to the current carrying cable.

9. The optical current sensor system of claim 1, further comprising:
- a light source configured to provide an input beam to the magneto-optical sensor;
- a light detector configure to receive and output beam from the magneto-optical sensor; and
- a sensor computing device coupled to the light detector and configured to receive one or more items of data from the light detector based on the output beam measure a current of the current carrying cable based on the one or more items of data from the light detector.

10. The optical current sensor system of claim 9, wherein the one or more items of data are based on rotation information of the output beam.

11. A method of measuring current in a current carrying cable, the method comprising:
- installing the optical current sensor system of claim 9 on the current carrying cable; and
- measuring current in the current carrying cable using the optical current sensor system.

12. The method of claim 11, wherein the current carrying cable is a transmission line.

13. The method of claim 12, wherein the transmission line is located in a smart grid.

14. The method of claim 11, wherein the optical current sensor system is installed without altering the current carrying cable.

15. The method of claim 11, wherein measuring current in the current carrying cable further comprises:
- receiving, by the sensor computing device, one or more items of data from the light detector based on the output beam; and
- measuring, by the sensor computing device, the current in the current carrying cable based on the received one or more items of data.

16. The method of claim 15, wherein the one or more items of data are based on rotation information of the output beam.

* * * * *